United States Patent
An et al.

(10) Patent No.: US 9,532,179 B2
(45) Date of Patent: Dec. 27, 2016

(54) TRANSPORTING RESIDUE OF VEHICLE POSITION DATA VIA WIRELESS NETWORK

(71) Applicant: International Business Machines Corporation, Armonk, NY (US)

(72) Inventors: Wen Hao An, Beijing (CN); Liya Fan, Beijing (CN); Bo Gao, Beijing (CN); Xi Sun, Beijing (CN); Yuzhou Zhang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 14/682,222

(22) Filed: Apr. 9, 2015

(65) Prior Publication Data
US 2015/0213714 A1   Jul. 30, 2015

Related U.S. Application Data

(62) Division of application No. 13/832,481, filed on Mar. 15, 2013.

(30) Foreign Application Priority Data

Mar. 30, 2012   (CN) .......................... 2012 1 0091267

(51) Int. Cl.
*H04W 4/02*   (2009.01)
*G08G 1/127*   (2006.01)
(Continued)

(52) U.S. Cl.
CPC ............ *H04W 4/028* (2013.01); *G08G 1/0112* (2013.01); *G08G 1/0129* (2013.01); *G08G 1/127* (2013.01);
(Continued)

(58) Field of Classification Search
None
See application file for complete search history.

(56) References Cited

U.S. PATENT DOCUMENTS

| 7,593,999 B2 | 9/2009 | Nathanson |
| 8,644,843 B2 * | 2/2014 | Canon ................... H04W 64/00 455/456.1 |

(Continued)

FOREIGN PATENT DOCUMENTS

| CN | 1461527 A | 12/2003 |
| CN | 101713822 A | 5/2010 |
| CN | 102099656 A | 6/2011 |

OTHER PUBLICATIONS

U.S. Appl. No. 13/832,481, 2 pages.
(Continued)

*Primary Examiner* — John R Olszewski
*Assistant Examiner* — David Merlino
(74) *Attorney, Agent, or Firm* — Francis Lammes; Stephen J. Walder, Jr.; Jeff Tang

(57) ABSTRACT

The invention relates to compressed data transmission in wireless data communication. Disclosed are methods and apparatuses for transporting residue of vehicle position data via a wireless network. A disclosed method for transporting residue of vehicle position data via a wireless network, includes the steps of: receiving data for updating residue encoding schema from a monitoring server; constructing a residue encoding schema based on the data, thereby producing a constructed residue encoding schema; and storing the constructed residue encoding schema such that the constructed residue encoding schema will become the current residue encoding schema; where: the constructed residue encoding schema is constructed such that each residue of the constructed residue encoding schema corresponds to a code; and the constructed residue encoding schema is (Continued)

constructed such that a residue having a relatively high probability of occurrence corresponds to a code of relatively short length.

5 Claims, 3 Drawing Sheets

(51) Int. Cl.
    *G08G 1/01*     (2006.01)
    *H04B 1/3822*     (2015.01)
    *H04W 28/06*     (2009.01)
    *H03M 7/40*     (2006.01)
    *H04W 64/00*     (2009.01)

(52) U.S. Cl.
    CPC ......... *H03M 7/4006* (2013.01); *H04B 1/3822* (2013.01); *H04W 28/06* (2013.01); *H03M 7/40* (2013.01); *H04W 64/00* (2013.01)

(56) References Cited

U.S. PATENT DOCUMENTS

| | | |
|---|---|---|
| 2003/0093221 A1 | 5/2003 | Adachi |
| 2005/0184904 A1 | 8/2005 | Humphries et al. |
| 2006/0227020 A1 | 10/2006 | Adachi et al. |
| 2006/0244587 A1 | 11/2006 | Humphries et al. |
| 2007/0244614 A1 | 10/2007 | Nathanson |
| 2008/0082221 A1 | 4/2008 | Nagy |
| 2009/0279462 A1 | 11/2009 | Luo et al. |
| 2010/0087984 A1 | 4/2010 | Joseph |
| 2010/0191675 A1 | 7/2010 | Rosenbaum |
| 2011/0119232 A1 | 5/2011 | Mielke et al. |
| 2012/0143402 A1 | 6/2012 | Kim et al. |

OTHER PUBLICATIONS

U.S. Appl. No. 14/682,215, 1 page.
U.S. Appl. No. 14/682,239, 1 page.
Al-Taee, Majid A. et al., "Remote Monitoring of Vehicle Diagnostics and Location Using a Smart Box with Global Positioning System and General Packet Radio Service", IEEE Conference on Computer Systems and Applications, May 13-16, 2007, pp. 385-388.
Gogate, Col.Anil et al., "Monitoring and Transmission of Heavy Vehicle Parameters Using Fixed Cellular Terminal", IEEE Vehicular Technology Conference, Sep. 26-29, 2004, pp. 4100-4102.

* cited by examiner

//<br>
TRANSPORTING RESIDUE OF VEHICLE POSITION DATA VIA WIRELESS NETWORK

CROSS-REFERENCE TO RELATED APPLICATION

This application claims priority under 35 U.S.C. §119 from China Patent Application No. 201210091267.7 filed Mar. 30, 2012 the entire contents of which are incorporated herein by reference.

BACKGROUND OF THE INVENTION

Field of the Invention

The invention relates to wireless data communication and, in particular, to a method and apparatus for transporting vehicle position data via the wireless communication network system.

Description of Related Art

With the development of wireless networks and the popularity of the Global Positioning System (GPS), a growing number of transportation companies and traffic management departments use wireless networks and the GPS system to determine the real-time location of a moving vehicle.

In such applications, the GPS device equipped on a vehicle can receive satellite signals and can determine the position data representing the position of the vehicle based on the signals. A backend server in charge of determining the position of the vehicle exchanges information with the vehicle through a wireless network. The vehicle needs to continuously transport the position data determined by the GPS device, consuming a large amount of bandwidth of the wireless network.

U.S. patent application US2006/0244587A1 discloses a method and apparatus of transportation of compressed measurement data in order to reduce the amount of measurement data, such as position data, needing to be transported via wireless networks. The means of the method for compressing measurement data is to transport the difference (also known as "residue") between the current measurement data and the reference data, and convert the difference into a variable-length code using a particular encoding schema, for example, converting an integer "24" as the difference into a binary "1011 0000". Since what is actually transported is the variable-length code for the difference, the amount of the measurement data needing to be transported is compressed.

SUMMARY OF THE INVENTION

The present invention provides a method for transporting residue of vehicle position data via a wireless network, includes the steps of: receiving code from a vehicle-mounted terminal; deriving position data of a vehicle from the code according to a current residue encoding schema; determining whether updating the current residue encoding schema is needed according to context information of the vehicle; generating data for updating the current residue encoding schema, if updating the current residue encoding schema is needed; transporting the data for updating the residue encoding schema to the vehicle, if updating the current residue encoding schema is needed; constructing a residue encoding schema based on the data for updating the current residue encoding schema, thereby producing a constructed residue encoding schema, if updating the current residue encoding schema is needed; and updating the current residue encoding schema with the constructed residue encoding schema, if updating the current residue encoding schema is needed; where: the code is code for residue of position data of the vehicle; the vehicle-mounted terminal is located in the vehicle; the current residue encoding schema corresponds to the vehicle; the constructed residue encoding schema is constructed such that each residue of the constructed residue encoding schema corresponds to one code; and the constructed residue encoding schema is constructed such that a residue having a relatively high probability of occurrence corresponds to a code of relatively short length.

The present invention also provides a method for transporting residue of vehicle position data via a wireless network, including the steps of: receiving data for updating residue encoding schema from a monitoring server; constructing a residue encoding schema based on the data, thereby producing a constructed residue encoding schema; and storing the constructed residue encoding schema such that the constructed residue encoding schema will become the current residue encoding schema; where: the constructed residue encoding schema is constructed such that each residue of the constructed residue encoding schema corresponds to a code; and the constructed residue encoding schema is constructed such that a residue having a relatively high probability of occurrence corresponds to a code of relatively short length.

The present invention further provides a monitoring server for transporting residue of vehicle position data via a wireless network, including: a storage device configured for storing historical data; a data analysis device, configured to generate a normalized residue distribution of position data of all vehicles that comply with a constraint condition; an encoding schema updating device, configured to calculate a probability of occurrence of a residue corresponding to a specific vehicle according to the normalized residue distribution; and construct a residue encoding schema, thereby producing a constructed residue encoding schema; and, a decoding device configured to derive a residue, which corresponds to a code, according to a residue encoding schema; where: the historical data includes real-time vehicle position data and associated context information; the constructed residue encoding schema is constructed such that each residue of the constructed residue encoding schema corresponds to one code; and, the constructed residue encoding schema is constructed such that a residue with a relatively high probability of occurrence corresponds to a code of relatively short length.

The present invention additionally provides a vehicle-mounted terminal for transporting residue of vehicle position data via a wireless network, including: a data acquisition device, configured to obtain position data of a vehicle; an encoding schema updating device, configured to calculate a probability of occurrence of a residue corresponding to the vehicle according to a normalized residue distribution, and construct a residue encoding schema according to the probability of occurrence, thereby producing a constructed residue encoding schema; a storage device, configured to store the constructed residue encoding schema; and an encoder, configured to generate a corresponding code of a residue according to the constructed residue encoding schema; wherein: the vehicle-mounted terminal is located in the vehicle; the constructed residue encoding schema is constructed such that each residue of the constructed residue encoding schema corresponds to one code; and the constructed residue encoding schema is constructed such that a residue with a relatively high probability of occurrence corresponds to a code of relatively short length.

DETAILED DESCRIPTION OF THE PREFERRED EMBODIMENTS

In view of the prior art, the inventors found that, under the same condition, the amount of variations or residue of the position data of the vehicle in moving generally complies with a certain law of distribution. The distribution law can reflect the probability of occurrence of residue for individual vehicles. Based on that, the compression encoding schema of the prior art may be improved.

Preferred embodiments of the present disclosure will be described in greater detail below with reference to the accompanying drawings. The accompanying drawings have shown those preferred embodiments of the present disclosure, however, it should be understood that, the present disclosure can be implemented in various forms, but are not limited to these embodiments illustrated herein. On the contrary, these embodiments are provided for making the present disclosure more thorough and complete, such that the scope of the present disclosure can be completely delivered to one of ordinary skill in the art.

Figure 1:
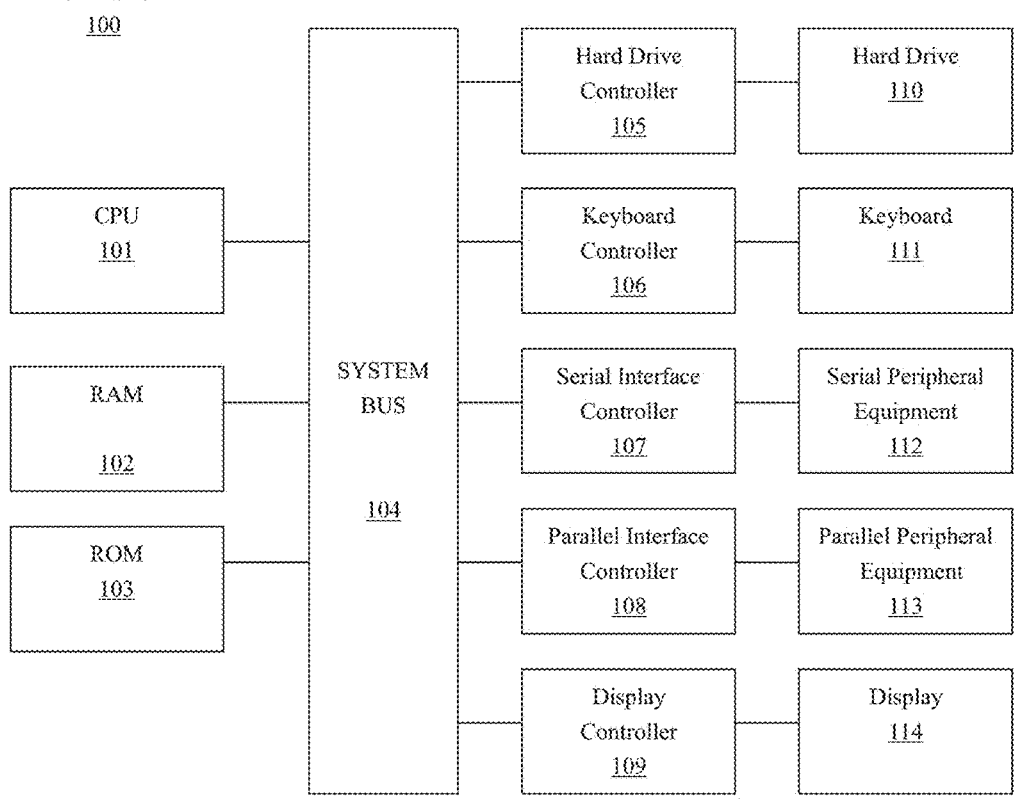
FIG. 1 shows a block diagram of an exemplary computing system 100 that is adapted to be used for implementing embodiments of the invention.

Referring to FIG. 1, a block diagram of an exemplary computing system 100 which is applicable to implement the embodiments of the present invention is shown. In FIG. 1, the computing system 100 may include: CPU (Central Processing Unit) 101, RAM (Random Access Memory) 102, ROM (Read Only Memory) 103, System Bus 104, Hard Drive Controller 105, Keyboard Controller 106, Serial Interface Controller 107, Parallel Interface Controller 108, Display Controller 109, Hard Drive 110, Keyboard 111, Serial Peripheral Equipment 112, Parallel Peripheral Equipment 113 and Display 114. Among above devices, CPU 101, RAM 102, ROM 103, Hard Drive Controller 105, Keyboard Controller 106, Serial Interface Controller 107, Parallel Interface Controller 108 and Display Controller 109 are coupled to the System Bus 104. Hard Drive 110 is coupled to Hard Drive Controller 105. Keyboard 111 is coupled to Keyboard Controller 106. Serial Peripheral Equipment 112 is coupled to Serial Interface Controller 107. Parallel Peripheral Equipment 113 is coupled to Parallel Interface Controller 108. And, Display 114 is coupled to Display Controller 109. It should be understood that the structure as shown in FIG. 1 is only for the exemplary purpose rather than any limitation to the present invention. In some cases, some devices may be added to or removed from the computer system 100 based on specific situations.

As will be appreciated by one of ordinary skill in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing.

More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2:
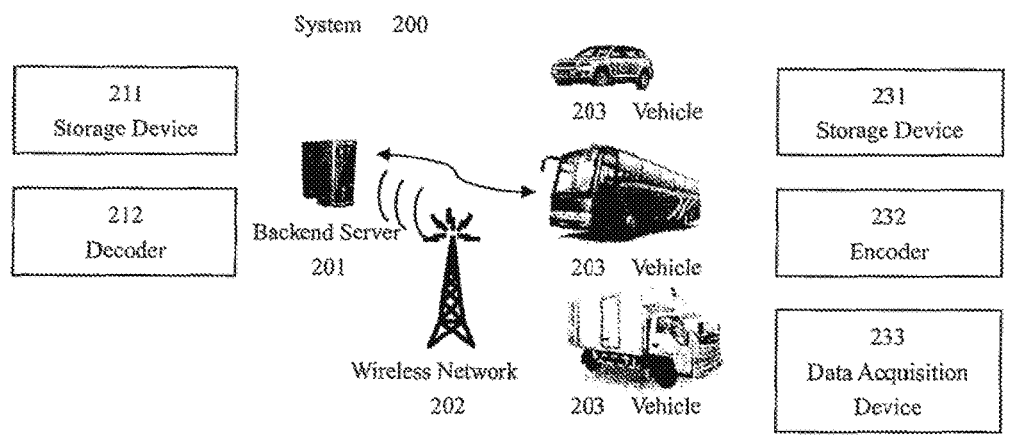
FIG. 2 illustrates a schematic diagram of a prior art system used to track the position of the vehicle.

To facilitate the understanding of the invention, reference is first made to FIG. 2 to describe the prior art techniques for tracking the vehicle position. FIG. 2 shows a prior art system 200 for tracking the vehicle position. The system 200 comprises a backend server 201, a wireless network 202 and a vehicle 203. Bidirectional communications may be performed to exchange information between the backend server 201 and the vehicle 203 through a wireless network 202.

In order to track the position of the vehicle 203, the backend server 201 needs the real-time position data (x, y, t) of the vehicle 203. The triplet represents the position coordinates or position data (x,y) at a time t, wherein x represents longitude and y represents latitude. The vehicle 203 may send its position data to the backend server 201 through the wireless network 202. To this end, the vehicle 203 may include a data acquisition device 233. The data acquisition device may acquire the real-time position data from, for example, a GPS device (not shown) equipped on the vehicle 203. The real-time position data acquired may be stored in a storage device 231. The data acquisition device may obtain the position data (x0, y0) of time t0 before time t1 from the storage device.

The difference or amount of variation between the position data (x1,y1) of the vehicle 203 at the current time t1 and the position data (x0, y0) at an earlier time t0 is referred to as "residue" and denoted as $\Delta x = x1-x0$ and $\Delta y = y1-y0$ or simply as $(\Delta x, \Delta y)$. The vehicle 203 may send the residue $(\Delta x, \Delta y)$ to the backend server 201. Based on the position data (x0, y0) at t0 and the residue (x1−x0, y1−y0) stored in a storage device 211, the backend server 201 may calculate the position data (x1, y1) at time t1 and store it in the storage device. Sending the residue instead of the position data themselves may reduce the amount of data for transmission.

Further, the vehicle 203 is equipped with an encoder 232 for encoding the residue (x1−x0, y1−y0). The encoder 232 uses an encoding schema to encode a decimal residue value into a binary coding, for example, the decimal residue of "24" is encoded into the binary "10110000". The vehicle 203 may transport the residue coding to the backend server 201. Compared to sending the residue itself, sending the residue coding may reduce the amount of data for transmission. Accordingly, the backend server 201 is configured with a decoder 212, which decodes the residue coding in accordance with the same encoding schema as used by the encoder 233 to obtain the residue $(\Delta x, \Delta y)$.

To facilitate narration, in the following description, the term "position data" refers to the position coordinates of the vehicle and is represented with such symbols as "x", "y" or "(x, y)", or any symbol derived from them. The term "residue" refers to the difference between two position data of adjacent sampling time points is represented with such symbols as "$\Delta x$", "$\Delta y$", "$(\Delta x, \Delta y)$" and the like.

The basic idea of the present invention is to analyze the distribution of the residues of the position data of the vehicle at different road sections according to historical data of moving vehicles. Based on the distribution of the residues, the probability of occurrence of respective residues of the position data of individual vehicles may be derived. The residues are encoded according to the probability of their occurrence and a relatively short code is used to represent a residue with relatively high occurrence probability, resulting in the overall reduction in the data amount of the code to be transported.

Figure 3:
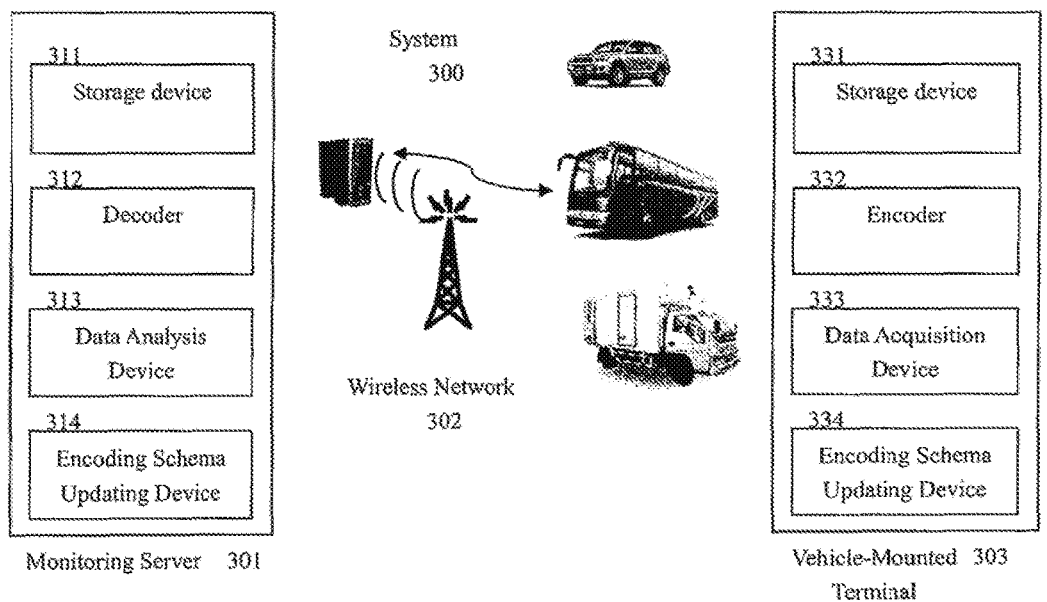
FIG. 3 illustrates a block diagram of the system and apparatus for transporting residue of the position data of the vehicle via a wireless network according to an embodiment of the invention.

Hereinafter, various embodiments of the present invention will be described with reference to the drawings. Refer now to FIG. 3, which illustrates a schematic diagram of the system according to an embodiment of the invention. The system 300 as shown is comprised of a monitoring server 301, a wireless network 302 and a vehicle-mounted terminal 303. The monitoring server 301 and the vehicle-mounted terminal 303 may conduct bidirectional communication via the wireless network 302 to exchange information with each other.

The vehicle-mounted terminal 303 is a computing device deployed in the vehicle, which may be embodied with the computer system 100 shown in FIG. 1. The vehicle-mounted terminal 303 comprises a storage device 331, an encoder 332 and a data acquisition device 333. Their functions are respectively similar to the storage device 231, the encoder 232 and the data acquisition device 233 shown in FIG. 2. In addition, the vehicle-mounted terminal 303 also comprises an encoding schema updating device 334.

The monitoring server 301 shown in FIG. 3 may also be embodied with the computer system 100 shown in FIG. 1.

The monitoring server 301 comprises a storage device 311 and a decoder 312, their functions are respectively similar to the storage device 211 and decoder 212 shown in FIG. 2. In addition, the monitoring server 301 also comprises a data analysis device 313, and an encoding schema updating device 314. Components of the monitoring server 301 are described in the following.

In the storage device 311 there is stored historical data, which includes real-time vehicle position data (x, y, t) and the associated context information. The historical data may be stored in easily searchable databases. The real-time position data may be the position data (x, y) at time t, received from the vehicle-mounted terminal 303. It may also be derived from the residue ($\Delta x$, $\Delta y$) received from the vehicle-mounted terminal 303, as discussed above with reference to FIG. 2.

The context information includes, for example:

The type of vehicle, such as car, truck, bus, etc. The type of any particular vehicle in which the vehicle-amounted terminal 303 is located may be recorded when the vehicle-amounted terminal 303 is registered with the server 301 for service.

Road section, i.e. a section of road in the road network corresponding to the position data (x, y). The mapping relationship between the position data (x, y) with the road section may be obtained by using the geographical information systems (GIS) known in the prior art.

Other context information may also include the weather condition corresponding to the time in the real-time position data (x, y, t), for example, "rainy", "misty", etc.

In the database there may be stored the context information in association with the real-time vehicle position data (x1, y1, t1), as shown in the following table:

| Vehicle -ID | Type | Road Section | Position | Time | ... |
|---|---|---|---|---|---|
| V1 | Truck | R1 | (x1, y1) | t1 | ... |
| ... | ... | ... | ... | ... | ... |

The first row of the table contains data names "Vehicle-ID", "Type", "Road Section", "Position" and "Time". In practical applications, there may be more such data names. Each of the rows below the first row represents a data value. For example, the data value of the second line denotes that the vehicle "V1" is of the type "Truck". At time t1, its position is (x1, y1), the corresponding road section being "R1".

In accordance with an embodiment of the invention, the data analysis device 313 may be configured to generate the normalized residue distribution of the position data of all vehicles complying with certain constraint condition according to historical data. The historical data may be obtained from the database stored in the storage device 311.

The constraint condition may be set to be either exactly the same as or matching the condition of the vehicles being tracked. For example, taking the specific time frame "9:00-9:30", the specific road section "R1" and the specific vehicle type "truck" as the constraint condition, the calculation of the normalized residue distribution of the position data of all vehicles may be divided into the following three steps.

Step 1: A set of real-time position data for all trucks running on the road section R1 in 9:00-9:30, S, is obtained from the historical data. Each item in the set S may be represented with "(vehicle_ID, x, y, t)".

Step 2: The normalized residue of the position data for each of the vehicles in the set S is obtained. The normalized residue of the position data for a vehicle may be obtained in the following manner. First, the residues of all position data of the vehicle are calculated. In general, if the real-time position data sampled at two adjacent time points for a vehicle V1 is P0=(x0, y0, t0) and P1=(x1, y1, t1), then the corresponding residue is: $\Delta x = x1-x0$; $\Delta y = y1-y0$. Then, the residue is normalized with the time interval $\Delta t = t1-t0$ to obtain the normalized residue: $\Delta x' = \Delta x/\Delta t$; $\Delta y' = \Delta y/\Delta t$. For example, the real-time position data obtained at two adjacent sampling instants with interval of 10 seconds is: P1=(120.67022, 31.26685, 10:01:03); P2=(120.67015, 31.26676, 10:01:13). Then the corresponding residue is: $\Delta x = 120.67015 - 120.67022 = -0.00007$; $\Delta y = 31.26676 - 31.26685 = -0.00009$. The residue $\Delta x = -0.00007$ and $\Delta y = -0.00009$ is normalized with $\Delta t = 10$ seconds to obtain the normalized residue as the following: $\Delta x' = \Delta x/\Delta t = \Delta x/10 = -7 \times 10^{-6}$; $\Delta y' = \Delta y/\Delta t = \Delta y/10 = -9 \times 10^{-6}$. The above process may be performed for all residues of one vehicle to obtain all normalized residues of the vehicle. The above process for all vehicles in the set S may be performed to obtain normalized residues of the position data for all vehicles in the set S.

Step 3: The distribution of all the normalized residues of the position data is obtained according to the normalized residues of the position data of all vehicles in the set S of all vehicles normalized residue. The distribution complies or approximately complies with the normal distribution $N(\mu, \sigma)$ and reflects the frequency distribution of all normalized residues, wherein, $\mu$ represents the mean value of the normal distribution and $\sigma$ represents the standard deviation. For example, the normalized residues of the position data of the vehicle under certain constraint condition (9:00-9:30, section R1, truck) comply with the normal distribution with the mean value $\mu$ of 0.0001 and the standard deviation $\sigma$ of 0.00002, denoted as N (0.0001, 0.00002). The above normalized residue distribution may be stored. For example, the normalized residue distribution N (0.0001, 0.00002) may be stored in Hashmap according to the following mapping relationship: (R1, {9:00-9:30 truck})->N (0.0001, 0.00002) . . . mapping (1). A plurality of such normalized residue distributions may be calculated in advance and then stored. For example, another mapping relationship is: (R2, {9:00-9:30 truck})->N (0.0001, 0.00003) mapping (2). Wherein "R2" represents a road section different from the road section "R1", and the mapping (2) denotes that, under the constraint condition of {9:00-9:30, road section R2, truck}, the normalized residues of the position data of the vehicle comply with the normal distribution N (0.0001, 0.00003), wherein the mean value $\mu$ is 0.0001, and the standard deviation $\sigma$ is 0.00003.

In the above example it is illustrated that the data analysis device 313 may generate the normalized residue distribution of the position data of all vehicles that comply with certain constraint condition based on the historical data in the database. The constraint condition may be one that matches, or is equivalent to, the condition of the vehicle of which the position is being tracked, for example, the type of vehicle, the road section where the vehicle is located, and so on.

According to an embodiment of the present invention, the encoding schema updating device 314 may be configured to compute the probability of occurrence of the residues for a specific vehicle according to the normalized residue distribution—for example, the normal distribution $N(\mu, \sigma)$.

The computation of the probability of occurrence of the residues corresponding to any specific vehicle in the set S may be conducted in two phases.

Phase 1, in which the sampling time interval based residue distribution is derived from the normalized residue distribution N ($\mu$, $\sigma$). Generally, if the time interval for sampling the position data of a certain vehicle is $\Delta t = t1-t0$, then the sampling time interval $\Delta t$ based residue distribution is as follows: N'($\mu'$, $\sigma'$), where $\mu'=\mu*\Delta t$; $\sigma'=\sigma*(\Delta t)$ ½. For example, if, for a vehicle V1 where the vehicle-mounted terminal 303 is located, the sampling time interval $\Delta t$ is 15 seconds, then, from the normalized residue distribution N (0.0001, 0.00002), it may be derived that the sampling time interval based residue distribution corresponding to the vehicle V1 in which the vehicle-mounted terminal 303 is located is normal distribution N'(0.0015, 0.0000775), where the mean value $\mu'$ equals to 0.0015, and the standard deviation $\sigma'$ equals to 0.0000775.

Phase 2, in which the probability of occurrence of the residue is calculated according to the sampling time interval based residue distribution. The probability of occurrence of any residue r may be calculated using the cumulative probability function $\phi$ corresponding to the sampling time interval based residue distribution N'($\mu'$, $\sigma'$), as shown in the following formula: $\phi((r+5*10^{-6}-\mu')/\sigma')-\phi((r-5*10^{-6}-\mu')/\sigma')$ ... formula (1). For example, to calculate the occurrence frequency of the residue $\Delta x = x1-x0$, the formula (1) may be used and let $r=\Delta x$, thereby obtaining the occurrence frequency of the residue $\Delta x = x1-x0$.

As to the cumulative probability function (Cumulative Distribution Function, CDF) of the standard normal distribution, reference may be made to "Probability Theory and Mathematical Statistics (J L Devore, 2000, Higher Education Press, pp. 149-158). In practical applications, the probability function can be stored in the form of lookup table in the local memory, such as the storage device 311, in order to realize fast query on the function. In the above it is described how to calculate the probability of occurrence of residue of position data.

According to an embodiment of the invention, the encoding schema updating device 314 may be configured to construct the residue encoding schema according to the probability of occurrence of residue such that each residue is corresponded to one code and a residue with relatively high probability of occurrence is corresponded to a code of relatively short length.

According to an embodiment of the invention, constructing the residue encoding scheme comprises using the Huffman encoding method to encode the residue. For example, given three residues $15*10^{-5}$, $14*10^{-5}$ and $16*10^{-5}$, it is assumed that the probability of their occurrence has been calculated to be 21%, 18% and 17% respectively. Accordingly, the residue encoding schema may be constructed to make the residues and their codes to have the following corresponding relationships in accordance with the level of probability of occurrence: $15*10^{-5}$–"0"; $14*10^{-5}$–"10"; $16*10^{-5}$–"110". Of these three residues, the probability of occurrence for the residue $15*10^{-5}$ is the highest, and the corresponding code "0" is the shortest. The probability of occurrence for the residue $16*10^{-5}$ is the lowest, and the corresponding code "110" is the longest.

Generally speaking, assuming there are n possible residues x1, x2, ... xn, and the probability of their occurrence is, respectively, f1, f2, ..., fn. If each of the residues is denoted with a binary number of b bits long, the average length of the n residues is: $L=(f1+f2+ ... +fn)*b$. According to the residue encoding schema, the corresponding codes of the residues x1, x2, ... xn are respectively x1', x2', ..., xn'. Assuming the length of xi' is li, then the average length of the codes is: $L'=(f1*l1+f2*l2+ ... +fn*ln)$. In accordance with the laws of probability and statistics, L' is less than L, meaning that the average length of all of the codes is less than the average length of the residues. In other words, using the codes instead of the residues would result in the data compression ratio of L'/L<1.

It should be noted that the present invention may use various frequency distribution based compression encoding schema. Those skilled in the art shall appreciate that, as long as the encoding schema is made to correspond to a source code with high frequency of occurrence to a target code of short length, the desired effect is achieved. Therefore, the present invention is by no means limited to the Huffman encoding schema.

According to an embodiment of the invention, the decoder 312 is configured to generate the corresponding residue of any code in accordance with the residue encoding schema constructed by the encoding schema updating device 314. In other words, when a code is received from the vehicle-mounted terminal, the decoder 312 will generate the residue corresponding to the code.

The encoding schema updating device 314 is configured to store the constructed residue encoding schema as the current residue encoding schema in place of the existing residue encoding schema in the storage device 311 for use by the decoder 312. Thus, the residue encoding schema used by the decoder 312 is the updated residue encoding schema. The function of the components of the monitoring server 301 has been described above.

In the following, components of the vehicle-mounted terminal 303 will be described in detail. In general, the vehicle-mounted terminal 303 for transporting the residue of vehicle position data via a wireless network according to an embodiment of the invention comprises: a data acquisition device 333 which is configured to obtain the position data of a vehicle in which the vehicle-mounted terminal is located; an encoding schema updating device 334 which is configured to calculate the probability of occurrence of the residue corresponding to the vehicle based on the normalized residue distribution and construct a residue encoding schema according to the probability of occurrence of the residue such that each residue is corresponded to one code and a residue with relatively high probability of occurrence is corresponded to a code of relatively short length; a storage device 331 which is configured to store the residue encoding schema; and an encoder 332 which is configured to generate the corresponding code of any residue according to the residue encoding schema stored in the storage device.

The encoding schema updating device 334 of the vehicle-mounted terminal 303 has the same function as the encoding schema updating device 314 of the monitoring server 301. For example, the encoding schema updating device 334 may calculate the probability of occurrence of the residue of the vehicle in which the vehicle-mounted terminal 303 is located based on $\mu$ value and $\sigma$ value received from the monitoring server 301 that characterize the normal distribution N ($\mu$, $\sigma$), and construct a residue encoding schema based on the probability of occurrence of the residue such that each residue is corresponded to one code and a residue with relatively high probability of occurrence is corresponded to a code of relatively short length. In other words, the higher the probability of occurrence of a residue, the shorter its corresponding code.

The residue encoding schema constructed by the encoding schema updating device 334 will be used by the encoder 332. For example, the encoding schema updating device 334 may store the constructed residue encoding schema as the current residue encoding schema in place of the existing residue encoding schema in the storage device 311 for use by the encoder 332. According to the residue encoding schema used by the encoder 332, residues with higher probability of occurrence correspond to shorter codes, i.e. the higher the probability of occurrence of a residue, the shorter the corresponding code. When the vehicle-mounted terminal 303 transmits the code from the encoder 332, the number of times of relatively short codes being transmitted is more than the number of times of relatively long codes being transmitted, thereby reducing the total length of the codes transmitted via the wireless network.

In practical applications, the encoding schema updating device 334 of the vehicle-mounted terminal 303 and the encoding schema updating device 314 of the monitoring server 301 construct the same residue encoding schema according to the same residue distribution data, the normal distribution N ($\mu$, $\sigma$) for example, as the current residue encoding schema. In this way, synchronization of the residue encoding schema at both sides of the monitoring server 301 and the vehicle-mounted terminal 303 is achieved. The above description has been provided on the function of various components of the system in accordance with an embodiment of the invention, in particular, the function of the data analysis device 313 of the monitoring server and the encoding schema updating device 314 of the monitoring server and the vehicle-mounted terminal.

Figure 4:
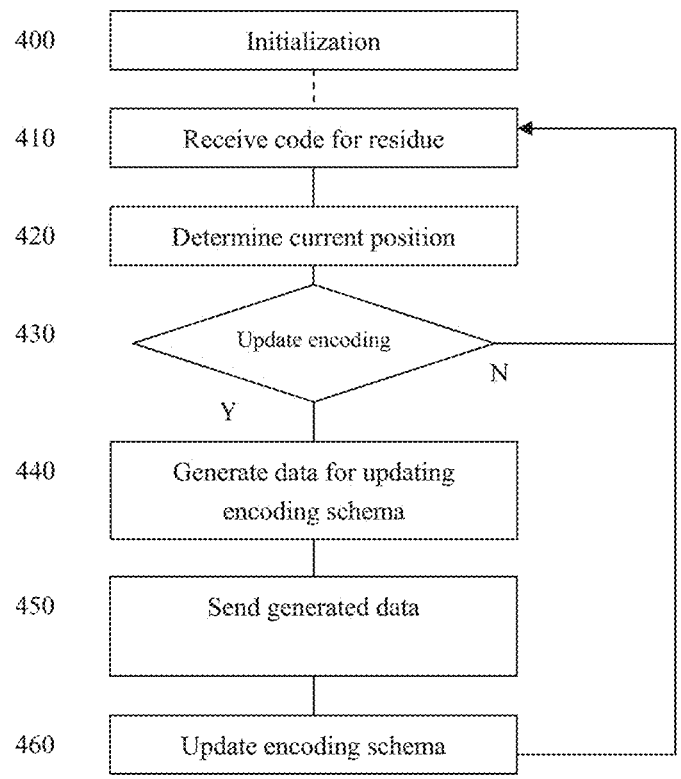
FIG. 4 illustrates a flowchart of the method for transporting residue of the position data of the vehicle via a wireless network according to an embodiment of the invention.

Various embodiments of the operation of the system will be further illustrated below on the basis of the above description. Referring to FIG. 4, a flowchart of the method according to an embodiment of the invention is illustrated. The method as shown may be performed by the monitoring server 301 for receiving residues of the vehicle position data via a wireless network.

The reference number 400 denotes an initialization step. In this step, the monitoring server 301 performs necessary initialization and establishes a session with the vehicle-mounted terminal 303 which is to be tracked. At the beginning, the vehicle-mounted terminal sends an initial position data to the monitoring server. In response, the monitoring server sends the data for constructing residue encoding schema to the vehicle-mounted terminal for it to generate a residue encoding schema. Meanwhile, the monitoring server also constructs the same residue encoding schema, thus causing the residue encoding schema used at both sides of the vehicle-mounted terminal and the monitoring server to be synchronized.

After the initialization, the monitoring server cyclically performs the following steps. In Step 410, the monitoring server receives, from the vehicle-mounted terminal, the code for residue of position data of the vehicle in which the vehicle-mounted terminal is located. As described above, the vehicle-mounted terminal 303 may send the code for residue according to the agreement between the vehicle and the monitoring server and in a predetermined format, so as to compress the amount of data to be transmitted via the wireless network. For example, the server receives, from the vehicle-mounted terminal, binary codes "0" and "10", which respectively represent the actual value of the residue of x and y in the position data (x, y).

In Step 420, the vehicle position data is derived from the received code according to the current residue encoding schema corresponding to the vehicle in which the vehicle-mounted terminal 303 is located. For example, according to the current encoding schema, the code "0" represents the residue 15*10−5 of x in the position data (x, y) and the code "10" represents the residue 14*10−5 of y in the position data (x, y). According to the residue of the position data (x, y) and the sampling period of the position data as well as historical data, the vehicle's current position data (x1, y1) at a time t1 may be obtained. Obtaining real-time position data (x1, y1, t1) according to residue of position data, to which there are already solutions in the prior art, is not a problem to be solved by the invention and therefore there is no need to repeatedly describe here. The vehicle position data derived from the received code will be stored. In practical applications, the real-time position data (x1,y1, t1) obtained may be stored in the form of database, together with associated contextual data, into the storage device 311 as historical data.

In Step 430, it is determined, according to the environment of the vehicle, whether it is needed to update the current residue encoding schema. Theoretically, the encoding schema may be updated at any time, i.e. a new encoding schema is used in place of the encoding schema being used at the monitoring server 301 and vehicle-mounted terminal 303. In practical applications, a change in the vehicle's environment (e.g., road section, time, weather) may be taken as the appropriate timing of updating the encoding schema. For example, given appropriate division of road sections, changes of the driving environment would be little on the same road section and so would be the vehicle's driving speed. At this time, it normally does not need to update the encoding schema. If the vehicle enters into another section R2 from a section R1, the driving environment may change greatly and it would be appropriate to update the encoding schema at this time.

According to an embodiment of the invention, said determination of whether it is needed to update the current residue encoding schema according to the environment of the vehicle in Step 430 comprises: determining that it is needed to update the residue encoding schema when it is judged, based on the derived vehicle position data, that the road section in which the vehicle is located is changed, for example, from one road section R1 to another road section R2.

As mentioned in previous paragraphs, with the help of the GIS system, the road section in which the vehicle is currently located can be determined according to the mapping relationship between vehicle position data and road sections in the road network.

If, in Step 430, it is determined that the encoding schema needs to be updated, the process proceeds to Step 440; otherwise, the process returns to Step 410. In Step 440, in response to determining that it is needed to update the current residue encoding schema, the data for updating encoding schema is generated. According to an embodiment of the invention, the data for updating encoding schema may be the mean value $\mu$ and the standard deviation $\sigma$ that characterize a normalized residue distribution N($\mu$, $\sigma$) of the position data.

As described above with reference to FIG. 3, the data analysis device 313 of the monitoring server 301 may generate the normalized residue distribution of the position data of all vehicles complying with certain constraints according to historical data. For example, a truck moves into the road section R2 from the road section R1. As described above with reference to FIG. 3, according to the constraint condition {R2, 9:00-9:30, truck}, feature values for the normalized residue distribution satisfying the constraint condition may be generated, for example, values of the mean value $\mu$="0.0001" and the standard deviation $\sigma$ "0.00003" for N(0.0001, 0.00003). Of course, if, as described above in connection with FIG. 3, the following mapping relationship has already been stored in Hashmap: (R2, {9:00-9:30 truck})->N (0.0001,0.00003) . . . Mapping (2). Then, the data characterizing the normal distribution N (0.0001, 0.00003), namely the mean value μ="0.0001" and the standard deviation σ "0.00003", may be retrieved directly from the Hashmap.

In Step 450, the data for updating encoding schema, for example, the mean value μ and the standard deviation σ that characterize a normalized residue distribution N(μ, σ) of the position data, may be transmitted to the vehicle-mounted terminal.

In Step 460, the residue encoding schema is constructed based on the data for updating residue encoding schema, wherein each residue in the residue encoding schema is corresponded to one code and a residue with relatively high probability of occurrence is corresponded to a code of relatively short length. The current residue encoding schema corresponding to the vehicle, in which the vehicle-mounted terminal 303 is located, is updated with the constructed residue encoding schema. Step 460 may be performed either before or after Step 450.

As previously described with reference to FIG. 3, prior to constructing the residue encoding schema, the monitoring server 301 has already derived the sampling time interval based residue distribution N'(μ', σ') corresponding to the vehicle in which the vehicle-mounted terminal is located from the normalized residue distribution N (μ, σ).

According to an embodiment of the invention, in Step 350 of transmitting the data for updating encoding schema to the vehicle-mounted terminal, the mean value μ' and the standard deviation σ' that characterize the sampling time interval based residue distribution N' (μ', σ') corresponding to the vehicle in which the vehicle-mounted terminal is located may be transmitted.

In the above description of the encoding updating device 314 of the monitoring server 301 with reference to FIG. 3, the manner of constructing the residue encoding schema based on the data for updating encoding schema has been described in detail, hence is omitted here. The constructed residue encoding schema may be stored in the storage device 311 as the current residue encoding schema in place of the existing residue encoding schema for use by the decoder 312.

Figure 5:
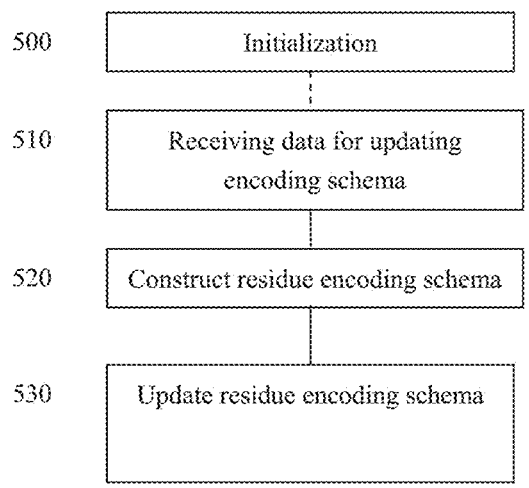
FIG. 5 illustrates a flowchart of the method for transporting residue of the position data of the vehicle via a wireless network according to another embodiment of the invention.

The embodiment of the method for transporting the residue of the vehicle position data via the wireless network performed at the monitoring server 301 has been described above. Below, with reference to FIG. 5, the method for transporting the residue of the vehicle position data via the wireless network performed at the vehicle-mounted terminal 303 in accordance with one embodiment of the invention will be described. The reference number 500 shows an initialization step. In this step, the vehicle-mounted terminal 303 performs necessary initialization and establishes a session with the monitoring server 301. As a part of the initialization, the vehicle-mounted terminal may transmit an initial position data to the monitoring server. After the initialization, the following steps are performed.

In Step 510, the data for updating encoding schema is received from the monitoring server 301. According to an embodiment of the invention, the data for updating encoding schema is the mean value μ and the standard deviation σ that characterize the normalized residue distribution N(μ, σ) of the position data of all vehicles that comply with certain constraint condition all the position.

In Step 520, a residue encoding schema is constructed based on the data for updating encoding schema and the constructed encoding schema is used to take the place of the current encoding schema, wherein each residue in the residue encoding schema is corresponded to a code and a residue with higher probability of occurrence is corresponded to a shorter code. Step 520 is implemented in substantially the same manner as Step 520 performed by the monitoring server 301 as described above with reference to FIG. 4. According to an embodiment of the invention, said Step 520 of constructing a residue encoding schema based on the data for updating encoding schema comprises: deriving the sampling time interval based residue distribution of the vehicle in which vehicle-mounted terminal is located according to the mean value and the standard deviation; and calculating the probability of occurrence of residue.

According to another embodiment of the invention, the data for updating encoding schema is the mean value μ' and the standard deviation σ' of the sampling time interval based residue distribution N'(μ',σ') of the vehicle in which the vehicle-mounted terminal is located. Under this circumstance, when constructing a residue encoding schema based on the data for updating encoding schema, it is possible to calculate the probability of occurrence of residue directly according to the sampling time interval based residue distribution. According to an embodiment of the invention, said constructing the residue encoding schema comprises using the Huffman encoding method for encoding the residue.

In Step 530, the constructed residue encoding schema is stored and made to be the current residue encoding schema. The constructed residue encoding schema may be stored into the memory device 331 as the current residue encoding schemas in place of the existing residue encoding schema for use by the encoder 332. Thereafter, the vehicle-mounted terminal 303 may responds to the need of sending the code for a residue to the monitoring server 310 by selecting the code corresponding to the residue according to the current residue encoding schema and transmitting the selected code to the monitoring server 310.

Various embodiments of the method for transporting transmit the residue of vehicle position data residue via the wireless network for execution on the monitoring server 301 and the vehicle mounted terminal 303 are described above. Since the monitoring server 301 and the vehicle mounted terminal 303 have been described in foregoing paragraphs, some of the content that is duplicate with the description of the monitoring server 301 and the vehicle-mounted terminal 303 is omitted from the description of the method.

Compared with the prior art, the various embodiments of the invention have significant technical effect. Using the residue encoding schema in which a residue with relative high probability of occurrence corresponds to a relatively short code, the data amount of the code for the residue needing to be transmitted via the wireless network may be reduced, thereby reducing the bandwidth consumption of the wireless network.

It is to be noted that, according to various embodiments of the invention, it is not necessary to send the residue encoding schema itself in order to synchronize the residue encoding schema between the monitoring server and the vehicle-mounted terminal. Rather, what is needed to be sent may be merely the feature data characterizing the residue distribution, for example the parameter μ and σ (or μ' and σ') for the normal distribution, and the wireless network bandwidth consumption additionally caused is negligible compared with the bandwidth saved.

Embodiments of the invention have been described. The above description is only exemplary, rather than exhaustive or limited to the embodiments disclosed. Those skilled in the art shall appreciate that various modifications and alterations changes thereto may be readily made. The choice of terms herein is intended for best explaining the principle, practical application or improvement to the techniques in the market of the embodiments, or allowing those skilled in the art to understand various embodiments disclosed herein.

The invention claimed is:

1. A monitoring server for transporting residue of vehicle position data via a wireless network, comprising:
   a storage device configured for storing historical data;
   a data analysis device, configured to generate a normalized residue distribution of position data of all vehicles complying with a constraint condition;
   an encoding schema updating device, configured to calculate a probability of occurrence of a residue corresponding to a specific vehicle according to the normalized residue distribution, and construct a residue encoding schema, thereby producing a constructed residue encoding schema; and
   a decoding device, configured to derive the residue corresponding to a code received from a vehicle-mounted terminal in the specific vehicle via the wireless network according to the residue encoding schema;
   wherein:
   the historical data includes real-time vehicle position data and associated context information;
   the constructed residue encoding schema is constructed such that each residue of the constructed residue encoding schema corresponds to one code; and
   the constructed residue encoding schema is constructed such that a residue with a relatively high probability of occurrence corresponds to a code of relatively short length.

2. The monitoring server of claim 1, wherein calculating the probability of occurrence of the residue corresponding to the specific vehicle according to the normalized residue distribution comprises:
   deriving a sampling time interval based residue distribution of the specific vehicle based on a mean value and a standard deviation, which characterize the normalized residue distribution; and
   calculating a probability of occurrence of a residue according to the sampling time interval based residue distribution.

3. The monitoring server of claim 2, wherein the encoding schema updating device is configured to use the Huffman encoding method to encode a residue.

4. The monitoring server of claim 2, further configured to send the mean value and the standard deviation, which characterize the normalized residue distribution, to the vehicle-mounted terminal.

5. The monitoring server of claim 1, wherein the encoding schema updating device is further configured to store the constructed residue encoding schema in the storage device as a current, residue encoding schema, thereby replacing an existing residue encoding schema.

* * * * *